(12) United States Patent
Gallegos et al.

(10) Patent No.: US 12,237,249 B2
(45) Date of Patent: Feb. 25, 2025

(54) SUBSTRATES WITH SOLDER BARRIERS ON LEADS

(71) Applicant: TEXAS INSTRUMENTS INCORPORATED, Dallas, TX (US)

(72) Inventors: Bernardo Gallegos, McKinney, TX (US); Madison Koziol, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/175,279

(22) Filed: Oct. 30, 2018

(65) Prior Publication Data
US 2020/0135627 A1 Apr. 30, 2020

(51) Int. Cl.
H01L 23/495 (2006.01)
H01L 21/48 (2006.01)
H01L 23/00 (2006.01)

(52) U.S. Cl.
CPC .... H01L 23/49582 (2013.01); H01L 21/4846 (2013.01); H01L 23/4952 (2013.01); H01L 23/49586 (2013.01); H01L 24/81 (2013.01); H01L 2224/81815 (2013.01)

(58) Field of Classification Search
CPC ........... H01L 23/49582; H01L 23/4952; H01L 23/49586; H01L 24/81
See application file for complete search history.

(56) References Cited

U.S. PATENT DOCUMENTS

| | | | | |
|---|---|---|---|---|
| 5,917,242 A | * | 6/1999 | Ball | H01L 24/73 257/737 |
| 5,929,511 A | * | 7/1999 | Nakazawa | H01L 21/565 257/666 |
| 6,577,012 B1 | * | 6/2003 | Greenwood | H01L 23/3107 257/E21.511 |
| 6,593,545 B1 | * | 7/2003 | Greenwood | B23K 37/06 257/E21.511 |
| 6,796,482 B2 | | 9/2004 | Wetz et al. | |
| 7,361,531 B2 | | 4/2008 | Sharma et al. | |
| 8,841,642 B2 | | 9/2014 | Yoshizumi | |
| 9,059,185 B2 | | 1/2015 | Abbott | |
| 8,952,529 B2 | | 2/2015 | Lee et al. | |
| 9,165,878 B2 | | 10/2015 | Yang et al. | |
| 9,934,989 B1 | * | 4/2018 | Williamson | H01L 23/49861 |
| 2006/0081969 A1 | * | 4/2006 | Ku | H01L 24/81 257/678 |
| 2007/0099348 A1 | * | 5/2007 | Sharma | H01L 23/4951 438/123 |
| 2009/0115067 A1 | | 5/2009 | Okimoto et al. | |

(Continued)

OTHER PUBLICATIONS

A Nickel-Palladium-Gold Integrated Circuit Lead Finish and Its Potential for Solder-Joint Embrittlement, Texas Instruments Incorporated, Dallas, Texas, Dec. 2001.

Primary Examiner — Nathan W Ha
(74) Attorney, Agent, or Firm — Dawn Jos; Frank D. Cimino

(57) ABSTRACT

A system comprises a substrate. The substrate comprises a lead. The system also comprises a solder barrier formed on the lead. The solder barrier is to contain a solder bump within a solder area on the lead. The system further includes a solder bump in the solder area and a die having an active surface coupled to the solder bump.

15 Claims, 2 Drawing Sheets

(56) References Cited

U.S. PATENT DOCUMENTS

| | | | | |
|---|---|---|---|---|
| 2010/0195292 | A1* | 8/2010 | Ide | H01L 23/3142 |
| | | | | 361/748 |
| 2010/0283144 | A1* | 11/2010 | Liang | H03H 9/0523 |
| | | | | 257/737 |
| 2012/0153447 | A1* | 6/2012 | Jiang | H01L 24/11 |
| | | | | 257/673 |
| 2013/0249070 | A1* | 9/2013 | Hsieh | H01L 23/49548 |
| | | | | 257/676 |
| 2013/0256873 | A1 | 10/2013 | Zhang et al. | |
| 2013/0277815 | A1* | 10/2013 | Lee | H01L 24/81 |
| | | | | 257/676 |
| 2013/0334671 | A1* | 12/2013 | Kuo | H01L 24/16 |
| | | | | 257/666 |
| 2013/0341073 | A1 | 12/2013 | Hsu et al. | |
| 2015/0001729 | A1* | 1/2015 | Lan | H01L 23/49827 |
| | | | | 257/773 |
| 2015/0048504 | A1 | 2/2015 | Wang | |
| 2015/0049421 | A1* | 2/2015 | Paek | H01L 23/16 |
| | | | | 361/676 |
| 2015/0084186 | A1* | 3/2015 | Chang | H01L 24/14 |
| | | | | 257/737 |
| 2016/0126166 | A1* | 5/2016 | Shi | H01L 23/49558 |
| | | | | 257/666 |
| 2016/0329269 | A1* | 11/2016 | Shih | H01L 23/49548 |
| 2017/0005058 | A1* | 1/2017 | Hurwitz | H01L 23/3135 |
| 2017/0103939 | A1* | 4/2017 | Gulpen | H01L 23/49548 |
| 2017/0236772 | A1* | 8/2017 | Yamagami | H01L 21/4825 |
| | | | | 257/676 |
| 2018/0190577 | A1* | 7/2018 | Gupta | H01L 23/49579 |
| 2018/0190608 | A1* | 7/2018 | Gupta | H01L 23/49531 |
| 2018/0190637 | A1* | 7/2018 | Kitazume | H05K 3/4007 |
| 2018/0294210 | A1* | 10/2018 | Schindler | H01L 21/4825 |
| 2018/0315912 | A1* | 11/2018 | Yun | H01L 24/16 |

* cited by examiner

SUBSTRATES WITH SOLDER BARRIERS ON LEADS

BACKGROUND

In many packaged integrated circuits, an integrated circuit on a silicon die (chip) is electrically coupled to a substrate. Conductive bumps on the integrated circuit are soldered to leads, the leads making up part of the substrate. Before soldering, the leads are commonly plated to improve solder wettability and to provide an oxidation barrier. However, soldering to unplated leads is also possible and applicable.

SUMMARY

A system comprises a substrate. The substrate comprises a lead. The system also comprises a solder barrier formed on the lead. The solder barrier is to contain a solder bump within a solder area on the lead. The system further includes a solder bump in the solder area and a die having an active surface coupled to the solder bump.

A method comprises plating a lead of a substrate for solder wettability to provide a plated lead, and forming a solder barrier on the plated lead. The solder barrier has a structure to contain solder reflow within a solder area on the plated lead.

A semiconductor package comprises a lead comprising a metal, a surface plating on the lead, a solder barrier on the surface plating to define a solder area, and a die having an active surface coupled to the solder area via a solder bump.

BRIEF DESCRIPTION OF THE DRAWINGS

For a detailed description of various examples, reference will now be made to the accompanying drawings in which.

DETAILED DESCRIPTION

In many packaged integrated circuits, leads are plated before solder is deposited. For example, the metal for the leads can be copper, and the plating finish can comprise nickel, palladium, and gold, with the gold deposited over the palladium, and the palladium deposited over the nickel to provide an oxidation barrier for the nickel. A nickel, palladium and gold metal finish serves as an example, but other kinds of metals, such as silver, can be used. Many other kinds of packaged integrated circuits include leads that are not plated.

In the case of leads having a plated surface, the plating finish commonly behaves as an etch-resistant metal to chemicals that are used for removing base metal (e.g., copper) during the etching process. But this can result in the plated portion of the metal extending beyond the metal (e.g., copper), creating an overhang. This overhang may result in burs or breakage, and can lead to a tilt in the integrated circuit during soldering of the conductive bumps to the plated leads. This overhang can be eliminated by relaxing design rules to allow a larger lead pitch, but such an approach can lead to an unwanted increase in silicon area and cost.

Embodiments disclosed herein include plating the leads after etching, and depositing solder barriers on the plated leads after the etching. The solder barriers are physical barriers for containing solder within defined spaces called solder areas. Specifically, the solder barriers define solder areas on the plated leads, where during bonding (e.g., during solder reflow) the solder barriers contain the solder to the solder areas. Plating the leads after etching mitigates the overhang of the plating relative to the metal without relaxing design rules.

Figure 1:
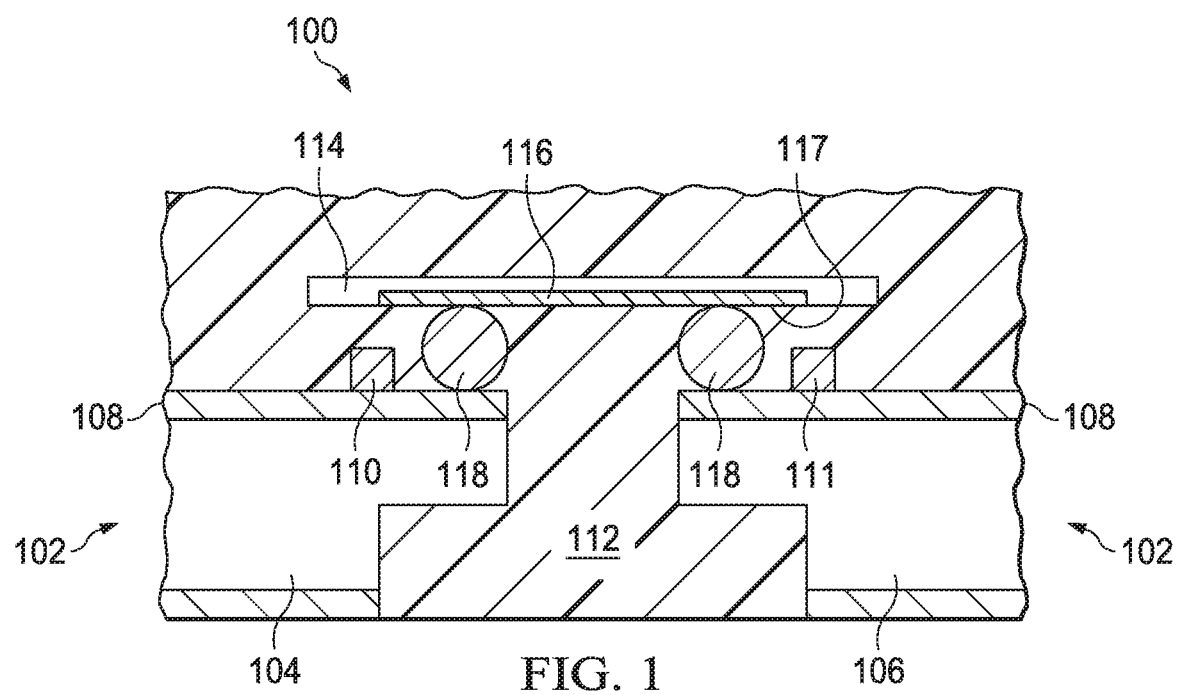
FIG. 1 illustrates a system (packaged integrated circuit) in accordance with various examples.

FIG. 1 depicts an illustrative system 100 comprising: a substrate 102, the substrate 102 comprising a lead 104; a solderable surface 108 on the lead 104; and a solder barrier 110 formed on the solderable surface 108. For some embodiments, the solderable surface 108 can be a plating finish, and in other embodiments lacking a plating finish, the solderable surface 108 is the metal of the lead 104. FIG. 1 is not drawn to scale, and represents a simplified cross-sectional depiction of the illustrative system 100. In the example of FIG. 1, a second lead 106 is shown, and embodiments can have more than two leads. The illustrative system 100 can also be referred to as a packaged integrated circuit.

The substrate 102 is a structure from which the leads (e.g., the lead 104 and the second lead 106) are obtained by etching or electroplating the substrate 102 when manufacturing the illustrative system 100. The structure of the substrate 102 can be altered during a manufacturing process, but it is convenient to refer to the structure labeled 102 as the substrate 102 when describing the embodiment of FIG. 1, even at the final stage of manufacture into a packaged integrated circuit.

In some embodiments, the metal for the lead 104 comprises copper. In embodiments that include a plating finish, the solderable surface 108 comprises nickel and palladium, and in some embodiments the solderable surface 108 further comprises gold. For example, the nickel may be deposited on the lead 104 (e.g., on copper of the lead 104), palladium may be deposited on the nickel, and gold may be deposited on the palladium. In some embodiments, the solderable surface 108 further comprises silver. Example alloy compositions for the plating finish include: NiAu, NiAu(PdAu), and NiPd(AuAg).

In some embodiments, the solder barrier 110 comprises a resin. In some embodiments, the solder barrier 110 comprises a metal, where in some such embodiments, the solder barrier comprises metallic dots. The metallic dots may be nano-sized dots. The illustrative system 100 comprises a mold compound 112 (e.g., epoxy) to protect and house the various components of the system 100.

The illustrative system 100 further comprises a semiconductor die 114 (e.g., silicon, gallium nitride) comprising an integrated circuit 116. The electrical components of the integrated circuit 116 are formed within the die 114, and various metal traces are formed in multiple layers to provide electrical pathways between the various electrical components of the integrated circuit 116. An outermost metal layer 117 may couple to the solderable surface 108 via conductive bump 118 (also known as a "solder bump"), as shown. In this manner, an electrical connection is established between the integrated circuit 116 and the lead 104. A similar electrical connection is established between the integrated circuit 116 and the lead 106. The outermost metal layer 117 may be referred to as an "active surface" of the die 114. In general, any surface of the die 114 that is electrically coupled to the integrated circuit 116 may be referred to as an "active surface" of the die. In some embodiments, the conductive bumps 118 are soldered to the solderable surfaces 108, which, as explained above, may be plated finishes on the leads 104, 106 or may be the metals of the leads 104, 106. FIG. 1 shows the conductive bumps 118 as having a spherical shape, although the shape may change during soldering.

FIG. 1 shows two solder barriers (e.g., the solder barrier 110 and a solder barrier 111), but embodiments can have more or fewer than two solder barriers, where in some embodiments there is a solder barrier for each lead making up the substrate 102. When soldering a conductive bump to a plated lead, the solder barrier on that plated lead contains the applied solder during the soldering process, as discussed with respect to FIG. 2 and FIG. 3. The solder barriers 110 and 11 do not physically contact the semiconductor die 114.

Figure 2A:
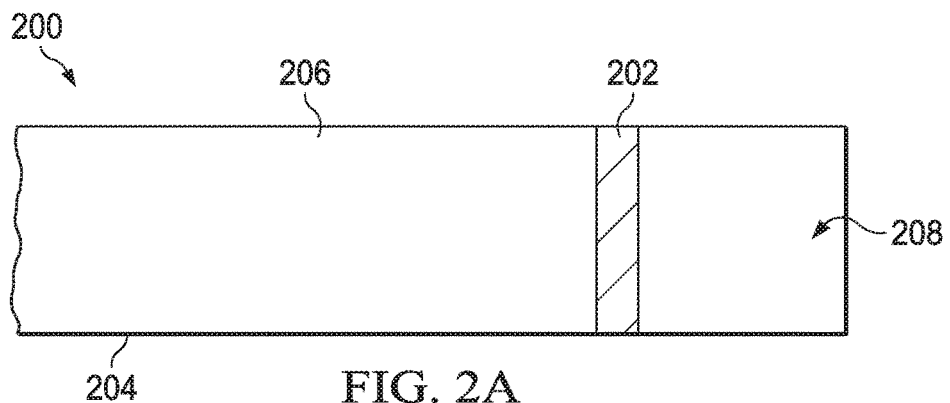
FIG. 2A illustrates a substrate with a solder barrier in accordance with various examples.

FIG. 2A shows a simplified plan view of a substrate 200 with a solder barrier 202. In some embodiments, the solder barrier 202 comprises a resin. The substrate 200, when plated, comprises a lead 204 and a lead finish 206 over its surface. The lead finish 206 can for some embodiments be referred to as a plating finish. The solder barrier 202 defines a solder area 208 on the lead finish 206. As shown in FIG. 2A the solder barrier 202 includes a rectangular shape from the top view with smooth edges. After finishing the lead 204, solder is applied to the solder area 208 portion of the lead finish 206, and because of the thickness of the solder barrier 202, during soldering the solder barrier 202 contains the applied solder in the solder area 208. In some embodiments, the solder barrier 202 can be applied using 3D printing technologies, including inkjet printing.

Figure 2B:
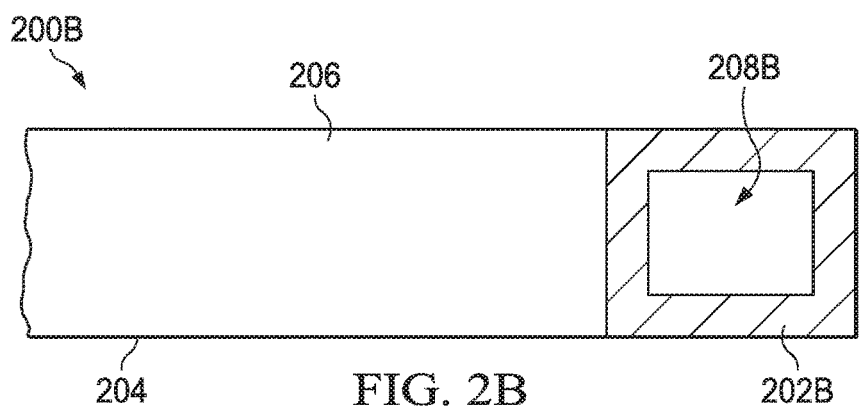
FIG. 2B illustrates a substrate with a solder barrier in accordance with various examples.
Figure 2C:
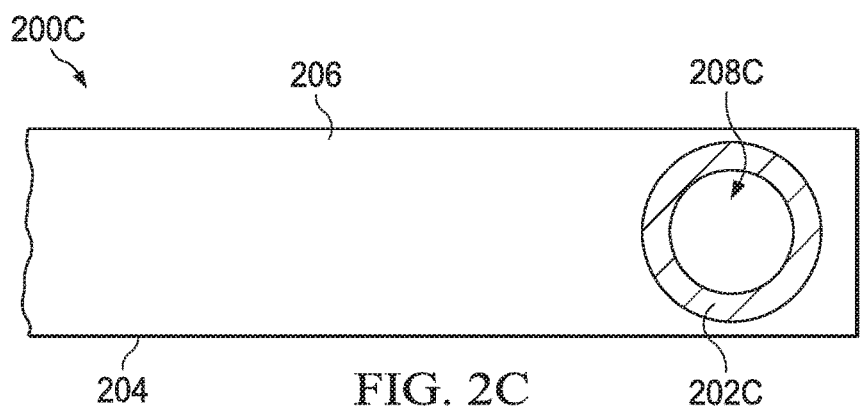
FIG. 2C illustrates a substrate with a solder barrier in accordance with various examples.

FIG. 2B shows a simplified plan view of a substrate 200B with a solder barrier 202B, where the solder barrier 202B is similar to the solder barrier 202 but includes additional material to form a rectangle. A solder area 208B is defined by the interior of the rectangle formed by the solder barrier 202B. Other embodiments may utilize solder barriers of closed or open shapes. For example, FIG. 2C shows a simplified plan view of a substrate 200C with a solder barrier 202C, where the solder barrier 202C is similar to the solder barrier 202 but forms a circle (or more generally, an ellipse). A solder area 208C is defined by the interior of the circle or ellipse formed by the solder barrier 202C.

In some embodiments, the solder barriers 202, 202B, and 202C of FIGS. 2A-2C are formed of resin, although other materials (e.g., non-conductive materials) are contemplated and included in the scope of this disclosure. The various dimensions (e.g., height, length, width, radius) of the solder barriers are variable and application-specific, and thus may be selected as desired. In some embodiments, each of these dimensions is less than 1 millimeter.

Figure 3:
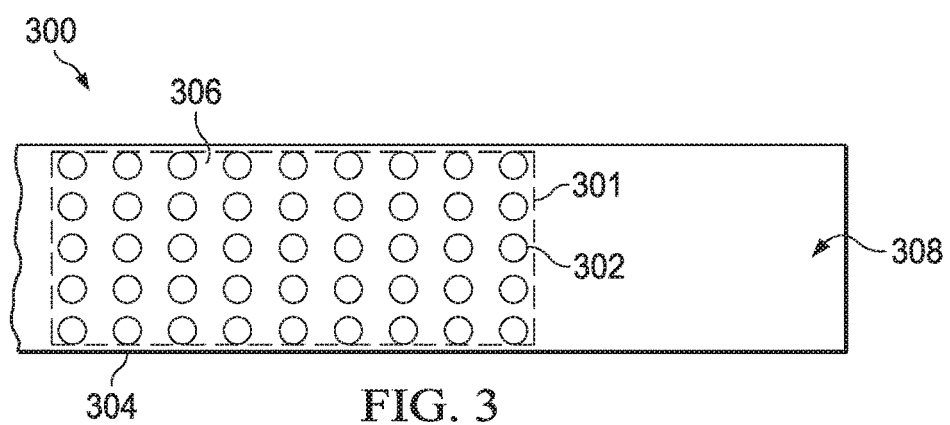
FIG. 3 illustrates a substrate with a solder barrier in accordance with various examples.

FIG. 3 shows a simplified plan view of a substrate 300 with a solder barrier 301. The solder barrier 301 is delineated by a dashed rectangle, indicating that the solder barrier 301 is formed by a set (or collection) of dots 302 within the dashed rectangle. In some embodiments, the dots 302 are metallic dots (i.e., the dots comprise a metal), and in some embodiments, the dots 302 comprise a resin. Other materials are contemplated and included in the scope of this disclosure. The substrate 300 comprises a lead 304 and a lead finish 306 over its surface. The solder barrier 301 defines a solder area 308 on the lead finish 306.

In the example of FIG. 3, the solder area 308 is that portion of the lead finish 306 not covered by the solder barrier 301, where solder is applied to the lead 304. Within this context, a dot is relatively small compared to the solder area 308. A dot 302 has a horizontal cross section that is circular or substantially circular, and a height profile that can depend upon its composition and surface tension. Because of the heights of the dots making up the solder barrier 301, during soldering (e.g., bonding of the applied solder during reflow), the solder barrier 301 contains the applied solder in the solder area 308. Other benefits of the solder barrier 301 include: increasing the surface area of contact of subsequent assembly materials (e.g., a mold compound resin), adding locking features, and adding adhesion promoters for improved reliability performance. The lead finish 206 in the embodiments of FIGS. 2A-2C and the lead finish 306 in the embodiment of FIG. 3 can have a smooth finish or a rough finish. Plating of the lead finish 206 or 306 can be done after a pre-mold leadframe operation.

Figure 4:
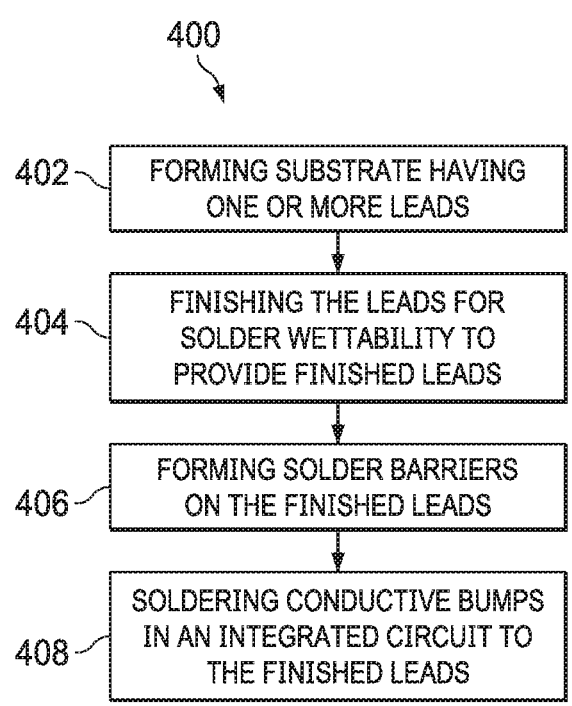
FIG. 4 illustrates a method in accordance with various examples.

FIG. 4 shows an illustrative method 400 comprising, in step 402, forming a substrate having one or more leads. For example, the various features of the substrate, including the leads, may be formed by obtaining a base metal (e.g., copper); applying a photoresist layer; tailoring the photoresist layer by exposing the photoresist layer to light using masks configured to achieve a desired photoresist configuration; and etching areas of the base metal not protected by photoresist (e.g., using any suitable etching process) to produce the desired substrate configuration. The illustrative method 400 further comprises, in step 404, finishing the leads for solder wettability to provide finished leads. For some embodiments, the step 404 of finishing the leads comprises plating the leads, such as for example with nickel and palladium. In some embodiments, the step 404 of finishing the leads further comprises plating with gold or silver. In embodiments where leads are plated, any suitable plating process may be used—for example, electroplating.

The illustrative method 400 further comprises, in step 406, forming solder barriers on the finished leads. The step 406 of forming solder barriers may include depositing resin on the finished leads, or for some embodiments, this step may include depositing metallic dots on the finished leads. Inkjet printing and using a metal stencil or mesh are examples by which a solder barrier can be deposited in step 406. For example, an inkjet printer can be aligned to a working substrate to start printing (where the alignment can be done automatically or manually depending on the inkjet printer features), with curing performed after dispensing the solder barrier. As another example, metal stencil or mesh printing can be employed and may be a candidate for substrates with relatively large feature sizes. Laser ablation, mechanical routing, or chemical etching can be employed after printing with a metal stencil or mesh. Curing can be performed after dispensing the solder barrier. If the solder barrier comprises dots as depicted in FIG. 3, the dots can be physically separated from each other or connected with each other. The illustrative method 400 further comprises, in step 408, soldering conductive bumps in an integrated circuit to the finished leads. As explained above, the bumps are positioned in solder areas, such as solder areas 208-208C (FIGS. 2A-2C) or solder area 308 (FIG. 3). In this manner, the solder barriers (e.g., solder barriers 110, 111 (FIG. 1), solder barriers 202-202C (FIGS. 2A-2C), solder barrier 301 (FIG. 3)) contain solder flow to the solder area(s) in which the solder was deposited.

In the foregoing discussion and in the claims, the terms "including" and "comprising" are used in an open-ended fashion, and thus should be interpreted to mean "including, but not limited to . . . " Also, the term "couple" or "couples"

is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A system comprising:
a metal substrate, the metal substrate comprising a lead;
a solder barrier on the lead projecting through a plane along a top surface of the lead, the solder barrier including a rectangular shape from a top view of the system wherein the solder barrier is not exposed from a surface of the system;
a solder bump adjacent the solder barrier, wherein the solder barrier is only on one side of the solder bump;
a die having an active surface coupled to the solder bump; and
a first mold compound contacting portions side surface of the lead, a bottom surface and the active surface of the die.

2. The system of claim 1, wherein the solder barrier comprises a resin.

3. The system of claim 1, further comprising a plating finish on the lead, wherein the solder barrier is formed on the plating finish.

4. The system of claim 1, wherein the solder barrier comprises metallic dots.

5. The system of claim 1, wherein the first mold compound contacts a top portion of the metal substrate.

6. The system of claim 1, wherein the die comprises an integrated circuit electrically coupled to the lead.

7. The system of claim 1, wherein the lead comprises copper.

8. The system of claim 1, further comprising a plating finish on the lead, the plating finish comprising nickel and palladium.

9. The system of claim 8, the plating finish further comprising a metal, the metal selected from the group consisting of silver and gold.

10. The system of claim 1,
wherein the metal substrate comprises a plurality of leads forming gaps therebetween, the plurality of leads including the lead,
wherein the solder barrier is one of a plurality of solder barriers formed on the plurality of leads,
wherein the solder bump is one of a plurality of solder bumps adjacent the plurality of solder barriers,
wherein the active surface of the die is coupled to each of the plurality of solder bumps.

11. A semiconductor package comprising:
a metal substrate including a lead;
a surface plating on the lead, the surface plating including nickel, palladium over nickel, and gold over palladium;
a solder barrier on the surface plating to define a solder area, the solder barrier including a rectangular shape from a top view of the semiconductor package, wherein the solder barrier is not exposed from a surface of the semiconductor package;
a die having an active surface coupled to the solder area via a solder bump; and
a first mold compound contacting portions side surface of the lead, a bottom surface and the active surface of the die.

12. The semiconductor package of claim 11, wherein:
the metal comprises copper.

13. The semiconductor package of claim 11, wherein the solder barrier comprises a resin.

14. The semiconductor package of claim 11,
wherein the metal substrate comprises a plurality of leads forming gaps therebetween, the plurality of leads including the lead,
wherein the surface plating is on each of the plurality of leads,
wherein the solder barrier is one of a plurality of solder barriers formed on the plurality of leads,
wherein the solder bump is one of a plurality of solder bumps adjacent the plurality of solder barriers,
wherein the active surface of the die is coupled to each of the plurality of solder bumps.

15. A system comprising:
a metal substrate, the substrate comprising a lead;
a plating finish on the lead, the plating finish including one of nickel, palladium over nickel, and gold over palladium;
a solder barrier formed on the plating finish, the solder barrier including a rectangular shape from a top view of the system wherein the solder barrier includes a metal;
a solder bump adjacent the solder barrier, wherein the solder barrier is only on one side of the solder bump;
a die having an active surface coupled to the solder bump; and
a first epoxy contacting a side surface of the lead, bottom surface of the die and the active surface of the die.

* * * * *